United States Patent [19]

Martyniak

[11] 4,361,862
[45] Nov. 30, 1982

[54] ASSEMBLIES OF ELECTRICAL COMPONENTS WITH PRINTED CIRCUIT BOARDS, AND PRINTED CIRCUIT BOARD STRUCTURES THEREFOR

[75] Inventor: Gerald J. Martyniak, Indianapolis, Ind.

[73] Assignee: Western Electric Company, Inc., New York, N.Y.

[21] Appl. No.: 194,179

[22] Filed: Oct. 6, 1980

Related U.S. Application Data

[62] Division of Ser. No. 38,742, May 14, 1979, Pat. No. 4,254,448.

[51] Int. Cl.³ .............................................. H05K 1/18
[52] U.S. Cl. .................... 361/404; 361/400; 361/401; 361/406
[58] Field of Search ............... 361/401, 403, 400, 406, 361/409, 404

[56] References Cited

U.S. PATENT DOCUMENTS

| | | | |
|---|---|---|---|
| 3,114,807 | 12/1963 | Koda | 361/401 X |
| 3,335,327 | 8/1967 | Damon | 361/403 |
| 3,652,974 | 3/1972 | Tems | 361/403 |
| 4,030,000 | 6/1977 | Stewart | 361/400 |
| 4,095,334 | 6/1978 | Uchida | 29/852 |
| 4,193,181 | 3/1980 | Boualnger | 29/509 |

FOREIGN PATENT DOCUMENTS 1080168  4/1960  Fed. Rep. of Germany ...... 361/400

OTHER PUBLICATIONS

P. R. Schulz, Circuit Board With Component Standoff, IBM Tech. Discl. Bull., v. 3 #6, Nov. 1960.

Primary Examiner—Richard R. Kucia
Attorney, Agent, or Firm—J. L. Landis; R. F. Kip, Jr.

[57] ABSTRACT

Electrical components (10 or 30) are fastened to a mounting surface (16) of a printed circuit board (11) by forming a plurality of thermoplastic pins (20, 35) projecting from the mounting surface of the board adjacent to positions where components are to be located. The component is placed on the board so that portions of the component are located adjacent to portions of the pins, following which portions of the pins are heated and formed about portions of the component to form plastic locking sections (22 or 37) that fasten the component to the board in a desired position. The mounting surface (16) of the board may be formed with a pocket (18 or 33) that receives and positions the component at the desired location, so that component leads (17 or 32) extend along the mounting surface to positions overlapping lead-contact areas (14, 34) of printed contact patterns deposited on the mounting surface, after which the leads are attached to the contact areas, as by reflow soldering.

11 Claims, 8 Drawing Figures

ASSEMBLIES OF ELECTRICAL COMPONENTS WITH PRINTED CIRCUIT BOARDS, AND PRINTED CIRCUIT BOARD STRUCTURES THEREFOR

CROSS-REFERENCE TO RELATED APPLICATION

This is a division of application Ser. No. 38,742 filed May 14, 1979 now U.S. Pat. No. 4,254,448.

TECHNICAL FIELD

This application relates generally to assembling electrical components with printed circuit boards, and to printed-circuit board structures and circuit-component assemblies of such nature. More particularly, the invention relates to improved techniques for mechanically fastening components to printed circuit boards having thermoplastic substrates, so that component leads may be bonded to conductive contact areas deposited on a mounting surface of the circuit board.

BACKGROUND OF THE INVENTION

In the past, electrical components have been attached to printed circuit boards by various different techniques. One process, commonly used with axial-leaded components such as resistors, involves inserting the leads into holes in the board, and then clinching or staking the tips of the leads to the board to mechanically fasten the component to the board, after which the leads are connected to conductive printed-circuit areas or contact pads on a surface of the board as by soldering.

Another process, "reflow soldering," as discussed in more detail hereafter, is often used with multiple flat-leaded components, such as integrated circuits, wherein the component is physically held against a mounting surface of the board with the leads engaging contact pad areas on that surface. Either or both of the leads and pads are coated with solder, and the solder areas are subject to localized heating to melt the solder and make a bond.

An object of this invention is to provide a simple, low-cost fastening technique, wherein components of various different sizes and shapes may be mechanically fastened to the board at desired locations prior to any standard lead-attach step, by simple plastics-molding and forming techniques and structures. The process is especially useful to provide high-integrity mechanical connections, particularly in a solder-reflow process, where the component leads cannot be inserted into holes in the board, and also for use with molded thermoplastic substrates.

SUMMARY OF THE INVENTION

With the foregoing and other objects in view, assemblies and products in accordance with certain features of the invention relate to assemblies of a component with a printed circuit board, wherein the board is formed with a plurality of thermoplastic pins projecting from the board adjacent to positions where a component is to be received. The component is placed on the board so that portions of the component are located adjacent to portions of the pins, and portions of the pins are formed about portions of the component so as to fasten the component to the board.

In accordance with other features of the invention, the printed circuit includes a molded thermoplastic substrate, the pins comprise molded thermoplastic elements extending outwardly from a mounting surface of the substrate, and the mounting surface is formed with a pocket for receiving and locating a body portion of the component so that projecting electrical leads of the component extend along the mounting surface of the substrate to positions in alignment with lead-contact areas of a printed circuit pattern deposited on the mounting surface. After the component has been fastened in place, the leads are attached to the contact areas in any suitable fashion, such as by reflow soldering. The mounting surface may be formed with grooves for receiving the leads, which grooves may be coated with conductive material to define the lead-contact areas in the grooves.

Other objects, specific advantages, and features of the invention will be apparent from the following detailed description of specific examples and embodiments thereof, when read in connection with the accompanying drawings.

DETAILED DESCRIPTION

Figure 1:
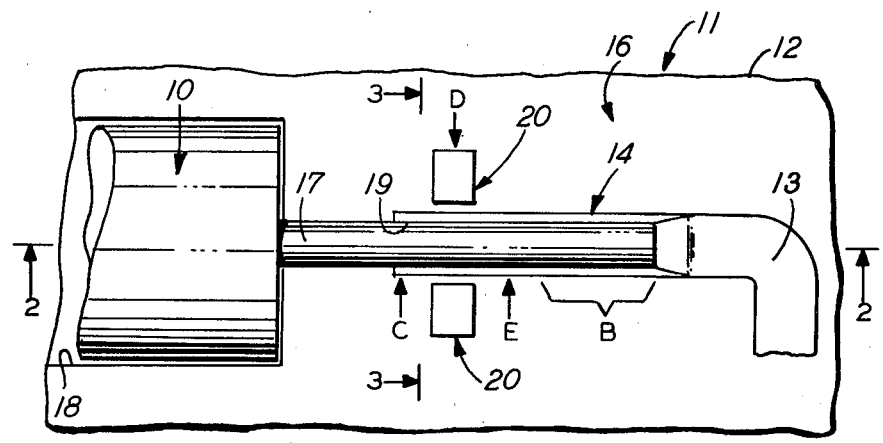
FIG. 1 is a top plan view of a portion of a printed circuit board and a cylindrical electrical component to be assembled therewith in accordance with one specific embodiment of the invention.

Referring now in detail to the drawings, FIGS. 1–5 illustrated techniques and mounting structure in accordance with one specific embodiment of the invention, for assembling an electrical component 10 with a printed circuit board 11. Preferably, the board 11 consists of a molded thermoplastic substrate 12, having printed-circuit conductor patterns, such as 13 and lead contact areas 14 deposited in any conventional fashion on a first, or component-mounting surface 16 of the substrate 12. In the example illustrated in FIGS. 1–5, the component 10 is a cylindrical resistor having axially projecting cylindrical leads 17 (one shown), which are to be bonded to corresponding contact areas 14 of the printed circuit 11 in any known fashion, such as a reflow soldering process described hereafter.

Figure 2:
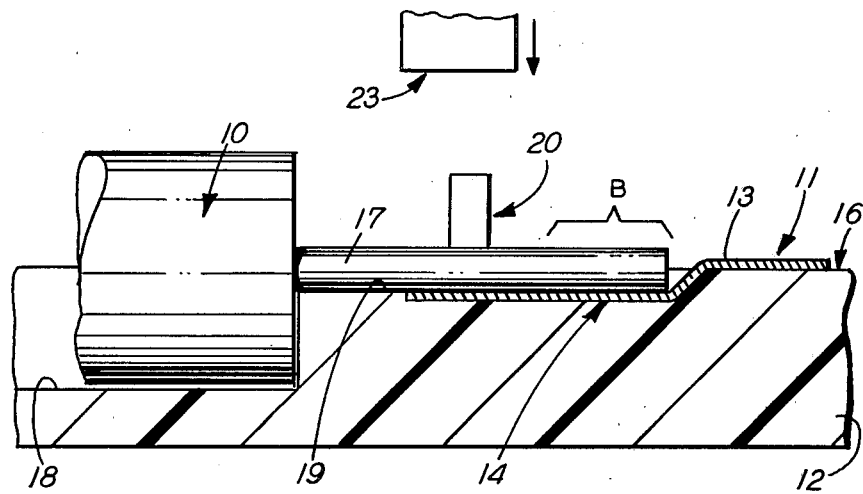
FIG. 2 is a vertical section along line 2—2 of FIG. 1, with certain vertical dimensions being exaggerated to illustrate principles.
Figure 3:
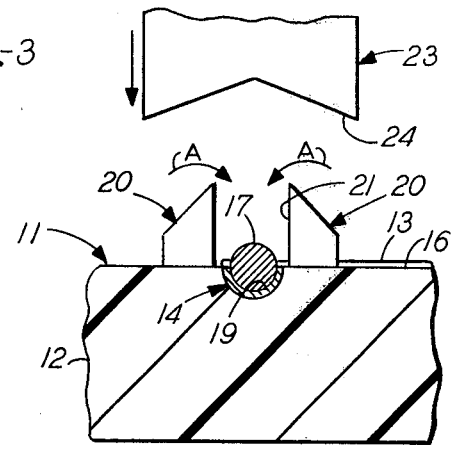
FIG. 3 is a transverse vertical section along line 3—3 of FIG. 1, illustrating certain elements prior to fastening of the component to the board.

In the case of an axial-leaded cylindrical component 10, such as illustrated in FIGS. 1–3, the substrate 12 is preferably formed with a hemicylindrical recess or pocket 18 molded into the mounting surface 16 of the substrate during manufacture. The pocket 18 is shaped to closely receive the cylindrical body of the component 10 so as to mount the component on the board at a desired location with the leads 17 extending along the mounting surface 16 of the substrate.

Preferably, the mounting surface 16 is also formed with molded arcuate grooves 19 for receiving and aligning each lead 17 in a desired position on the board. Portions of the groove 19 are preferably coated or plated with the printed circuit conductor material so as to define in the groove the lead-contact area 14 of the circuit, particularly along a lead-bonding region B near the right end in FIGS. 1-2. The conductive-groove contact area 14 is connected to and constitutes a continuation of one of the printed circuit conductors, such as the conductor 13 at the right in FIGS. 1-2. Alternatively, the contact area 14 in the groove may be connected to a transverse printed circuit conductor at any point along the conductive portion of the groove. While plated arcuate grooves 19 are preferred, particularly for relatively large-diameter cylindrical leads, to precisely locate the component leads relative to the printed circuit and to maximize surface contact area between the lead 17 and the contact area 14, it would also be possible to have the leads extend along a flat surface of the substrate in surface engagement with planar land areas or contact pads to which the leads are to be soldered or otherwise attached.

In accordance with certain features of this invention, in order to mechanically fasten the component 10 to the board 11 in the desired position preparatory to the lead-attach operation, the substrate 12 is formed with a plurality of thermoplastic studs or pins 20, projecting outwardly from the mounting surface 16 and defining spaces 21 (FIG. 3) therebetween for receiving portions of the component 10 adjacent to portions of the pins 20. In the example in FIGS. 1-5, the pins 20 are arranged to straddle a midsection of each lead 17 located between the component body and the end of the lead. That is, the pins are adjacent to positions where the leads are received and supportively backed by parts of the substrate 12 underlying grooves 19. Preferably, the pockets 18, grooves 19 and pins 20 are all formed during a plastics-molding operation process used to form the substrate 12.

After the component 10 has been properly positioned on the board 11 as illustrated in FIGS. 1-3, portions of the pins 20 are heated and formed about adjacent portions of the component 10, as generally indicated by arrows A—A in FIG. 3, so as to mechanically fasten the component to the board in the desired position. Preferably, the upper ends of the pins 20 are softened or melted and bent or caused to flow over adjacent portions of the component in any convenient fashion, as by ultrasonic melting or by utilizing a heated platen, to form a plastic locking section, such as section 22 in FIG. 5, that fastens the adjacent portions of the component to the board. As shown in that figure, upon completion of the operation of forming the upper ends of the pins about adjacent portions of the component 10 (such portions in this case being portions of the shown lead (7), the component will be simultaneously engaged in opposite sides thereof by, respectively, locking portions of the pins and a firm seat provided for the component on the substrate side thereof by the lead-contact area 14. Such simultaneous engagement provides a fastening without play of the component to the substrate.

Figure 4:
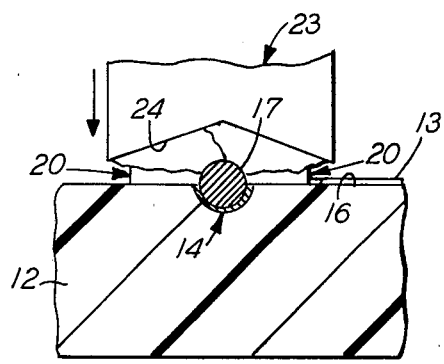
FIGS. 4–5 are views similar to FIG. 3, showing the elements during and after the fastening process.
Figure 5:
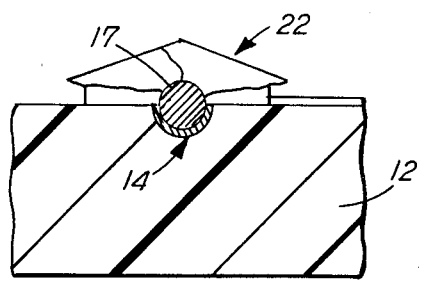

In the example of FIGS. 3-5, the plastic is simultaneously melted and formed by a generally conventional ultrasonic melting horn 23 having an angular, preferably V-notched face 24 shaped to melt the plastic tips of the pins 20 and to form the melted plastic into the desired shape of the locking section, as illustrated in FIGS. 4-5. In this example, the pins 20 are preferably rectangular tabs having flat vertical walls facing the mounting section of the component (lead 17 in FIG. 3), and having chamfered tips that taper downward toward the substrate 12 in the direction away from the center at an angle of about 45°, as illustrated in FIG. 3.

The use of chamfered pins 20, with pointed tips as illustrated in FIG. 3, facilitates the initiation of the plastic melting and forming process, as the pointed tips serve as energy directors for the horn 23. In practice, the horn 23 is lowered from the position shown in FIG. 3 to that of FIG. 4 engaging the upper surface of the molten plastic, so that the molten plastic is forced to flow inwardly and downwardly about the top of the lead 17 until it fills the entire space between the V-shaped face 24 of the horn 23 and the lead 17 and substrate 12 so as to form a secure plastic locking section about the lead 17, shaped as shown in FIGS. 4 and 5, after the horn 23 has been removed. In the example of FIGS. 1-3, where two pins 20—20 are positioned directly across from each other, the molten plastic material from the spaced pins runs together at the top, as shown in FIGS. 4-5 to form a joint locking section 22 covering and bridging the lead, wherein the jagged line at the top indicates a typical boundary line where the material from the two pins is joined together at the top. A limited amount of the molten material may also flow longitudinally outward along the length of the lead 17, to the left and right as viewed in FIGS. 1-2, and this provision furnishes a flow path for excess plastic material. In practice, the horn 23 has a length (from left-to-right in FIG. 2) about double the width of pins 20.

Figure 6:
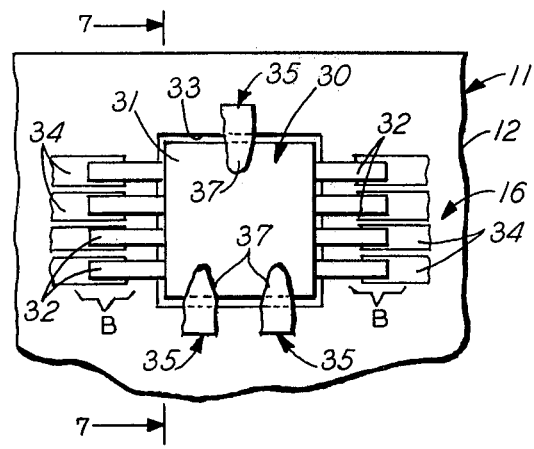
FIG. 6 is a top view similar to FIG. 1, showing techniques for fastening a flat component to the board.
Figure 7:
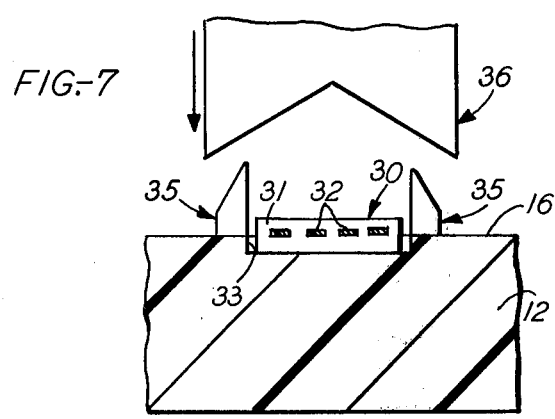
FIG. 7 is a transverse vertical section along line 7—7 of FIG. 6, illustrating certain elements prior to fastening the component to the board.
Figure 8:
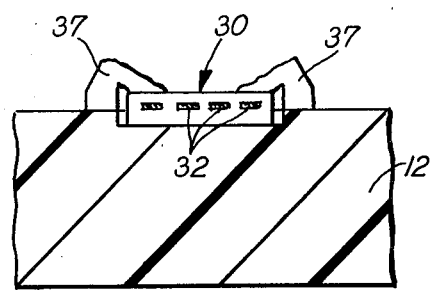
FIG. 8 is a view similar to FIG. 7, showing the parts after the fastening process.

As discussed hereafter in connection with FIGS. 6-8, it is also possible to use individual spaced pins, such as 20, mounted adjacent to the component or lead, wherein the molten plastic from two opposed pins does not flow together at the top as in the example of FIGS. 1-5. Also, it is possible to use various other heating-and-forming techniques, such as a heated platen similar in shape to the horn 23 in FIGS. 3-4, to melt the plastic and simultaneously form it about the adjacent portion of the component so as to make a desired shape of locking section 22.

After this component-fastening step, the leads 17 are then attached to the contact areas 14 of the printed circuit in any suitable fashion, such as by reflow soldering. In reflow soldering, either the adjacent surface of the lead 17 or of the contact section 14, or both, is precoated with solder, such as along the contact area B in FIGS. 1 and 2 between the pins 20 and the end of the lead. In this process, a heated platen (not shown) is moved down into engagement with the lead 17 along the contact section B, to apply localized heat to the lead 17 sufficient to melt the solder and form a secure bond, as is generally well known in the art. Localized heating processes, such as reflow soldering or laser soldering, are particularly preferred for use with thermoplastic substrates 12, to avoid possible damage to the substrate. However, it should be appreciated that any type of lead-attaching techniques can readily be used with the subject process of attaching components to printed circuits.

Of course, the thermoplastic pins or tabs 20, and any pockets 18 or grooves 19 utilized, are shaped and positioned to fit the particular size and shape of each individual component 10, so that the pins 20 may be heated and formed to fasten any desired portion of the component to the substrate in a desired position. In the case of a flat component, such as an IC pack 30 shown in FIGS. 6–8, for example a hybrid integrated circuit (HIC) having a flat rectangular body 31 and a plurality of projecting flat leads 32—32, the body 31 is received in a corresponding pocket 33 of the substrate 12 so that the ends of the leads 32 overlap and fit against lead-contact areas of printed circuit conductors 34—34 deposited on the substrate 12. In this example, it is preferred to provide a set of three or more pins or plastic tabs 35 (shown prior to the heating-and-forming step in FIG. 7) that are generally similar to the pins 20 in FIGS. 1–3 and are arranged on opposite sides of the IC pack 30; for example, in the three-tab offset top-and-bottom arrangement illustrated in FIG. 6, so as to be adjacent to positions at which pack 30 is supportively backed by part of the substrate 12 underlying the bottom of pocket 33.

In this example, a similar ultrasonic melting horn 36 is lowered to melt the upper portions of the tabs 35 and to form irregular locking sections 37, as shown in FIGS. 6 and 8, that lock the adjacent portions of the IC body section 31 to the substrate 12. After this, the leads 32 may be attached to the conductors 34 by any suitable process, such as reflow soldering at areas B—B of overlap between the leads 32 and the conductors 34, as previously described. As shown by FIG. 8, the IC body section 31 of the IC pack 30 is simultaneously engaged on opposite sides thereof by, respectively, the locking portions 37 and a firm seat provided for the pack on the substrate side thereof by the bottom of the pocket 33 in substrate 12. Such simultaneous engagement provides a fastening without play of the pack 30 to the substrate.

In the embodiment of FIGS. 1–3, it is not necessary that the pins 20—20 be mounted across from each other as shown in FIGS. 1–3, so that the melted portions run together to form a single composite locking section 22 as in FIG. 5. It is also possible to mount the pins in staggered positions on opposite sides of the lead 17, such as indicated by arrows C, D, E in FIG. 1, in which case the melted pin material forms isolated individual locking sections on opposite sides of the lead, similar to the individual locking sections 37 in FIGS. 6 and 8.

Where desired, a first set of components may be attached to one surface of the board, such as the upper surface 16 in FIGS. 1–8, and then the board 11 may be flipped over to attach additional components to the reverse side of the board. In a specific example of use of the invention, the printed circuit board 11 is used in a pushbutton "dial" assembly for a telephone, and may be of the type described in my copending U.S. patent application "Printed Circuits and Methods of Making," Ser. No. 970,946 filed Dec. 19, 1978, herein incorporated by reference. In that example, it is desired to attach all of the electrical components to a single side 16 of the board, the reverse side being used for printed switch-contact arrays operated by the pushbuttons. In this example, conductive through-hole connections may be made as disclosed in the copending application, wherever a component is to be connected to a switch contact on the reverse side of the board.

As described in the copending application, the substrate 12 is preferably formed of a molded thermoplastic material, such as "Ryton R-4," a polyphenylene sulfide material marketed by Phillips Petroleum Company of Bartlesville, Okla.; a polysulfone resin such as "Udel 1700," marketed by Union Carbide Corporation of New York, N.Y.; or a glass-filled ABS resin (acrylonitrile-butadiene-styrene resin), such as "AB-1004" marketed by Liquid Nitrogen Processing Corporation of Malverne, Pa. Thermoplastics are preferred because of low cost; ease in fabrication by conventional plastics-molding techniques, including formation of alignment holes, through holes, and component locating and assembly elements such as the pockets 18 and 33, the grooves 19, and the pins 20 and 35; and better sprayed-metal adhesion characteristics as discussed below.

As described in the copending application, the printed-circuit conductors are preferably flame-sprayed conductors of conductive metals, such as copper or nickel, deposited on a zinc primer coating on the substrate 12 in the desired patterns. This process is particularly useful in coating irregular substrate surfaces 16, as in the dial pad assembly described in the copending application, and also in coating surface grooves such as 19 to form the contact areas 14, while providing a continuous conductive area connection with an adjacent printed-circuit conductor such as the conductor 13 at the right in FIG. 2. However, as will be apparent, the present invention may readily be used with virtually any type of printed circuit and component assembly, and any type of lead-bonding or attaching process.

While various specific examples and embodiments of the invention have been described in detail hereinabove, it should be obvious that various modifications may be made from the specific details, steps and materials described, without departing from the spirit and scope of the invention.

What is claimed is:

1. An assembly comprising:
   a printed circuit board comprising a molded thermoplastic substrate having printed circuit lead-contact areas deposited on a mounting surface of the substrate;
   a plurality of preformed molded thermoplastic pins integral with said substrate and molded concurrently therewith to form extensions thereof, said pins each projecting outward of the adjacent outermost surface areas of said mounting surface, and each being disposed adjacent to positions where an electrical component is to be received so as to be supportively backed by part of said substrate; and
   an electrical component having leads projecting therefrom as portions thereof and mounted on the substrate so that portions of the component are located outward of the adjacent outermost surface areas of said mounting surface and adjacent to outer portions of the pins, and so that portions of the component leads are aligned with the contact areas of the printed circuit, the pins having at their outer ends plastic locking portions formed about said adjacent portions of the component by deformation of said ends after mounting of said component on said substrate so as to render said component simultaneously engaged on opposite sides thereof by, respectively, said locking portions and a firm seat provided for said component on the substrate side thereof, and so as by such simultaneous engagement to provide a fastening without play of said component to said substrate; and
   the component leads being attached to the contact areas.

2. An assembly as recited in claim 1, wherein the mounting surface of the substrate is formed with a pocket for receiving and locating a body portion of the component with respect to the printed-circuit lead-contact areas deposited on the mounting surface of the substrate.

3. An assembly as recited in claim 2 wherein the component leads project from the body portion; wherein the pocket is so formed and located that the leads extend from the body portion along the mounting surface of the substrate to positions overlapping the associated lead-contact areas of the printed circuit patterns; and wherein portions of the leads are attached to the contact areas.

4. An assembly as recited in claim 3, wherein the mounting surface of the substrate is also formed with grooves for receiving and aligning the leads with respect to the patterns.

5. An assembly as recited in claim 4 wherein portions of the grooves are coated with the printed-circuit conductor material to define the lead-contact areas in the grooves.

6. An assembly as recited in claim 4, wherein the component leads are cylindrical, and the grooves are arcuate grooves shaped to fit and make substantial surface contact with the leads.

7. An assembly as recited in any of claims 3, 4 or 5, wherein the leads are attached to the contact areas by reflow soldering.

8. An assembly as recited in claim 1, wherein at least two pins are positioned across from each other, and wherein end portions of the material from the two pins are molded together to form a joint locking section covering and bridging the adjacent portion of the component.

9. An assembly comprising:
   a printed circuit substrate composed of a molded thermoplastic material and having a component-mounting surface;
   an electrical component mounted on the substrate and having a body portion and axially extending leads, the substrate further having a pocket formed in the mounting surface for receiving and locating the body portion of the component with respect to the substrate so that the component leads extend along the mounting surface and so that at least part of said component projects outward of the adjacent outermost surface areas of said mounting surface;
   a plurality of preformed molded thermoplastic studs integral with said substrate and molded concurrently therewith as extensions thereof, said studs projecting outwardly of adjacent outermost surface areas of said mounting surface at spaced positions adjacent to selected portions of the component received in the pocket so as to be supportively backed by part of said substrate providing the bottom of said pocket, the studs at their outer ends having locking portions formed about said selected adjacent portions of the component by deformation of said ends after mounting of said component on said substrate so as to render said component simultaneously engaged on its opposite sides by, respectively, said stud locking portions and a firm seat provided for said component on the substrate side thereof at the bottom of said pocket, and so as by such simultaneous engagement to provide a fastening without play of such component to said substrate;
   a printed circuit conductor pattern deposited on the mounting surface and including lead-contact areas that are overlapped by portions of the leads of the component; and
   means for attaching the leads to the contact areas of the conductor pattern.

10. A printed circuit board structure having component parts capable of being assembled with an electrical component having leads projecting therefrom, which comprises:
    a molded thermoplastic substrate having printed circuit lead-contact areas deposited on a mounting surface of the substrate, on which mounting surface the component is adapted to be placed in a desired position at which at least part of said component projects outward of the adjacent outermost surface areas of said mounting surface, and in which portions of the component leads are aligned with the lead-contact areas; and
    a plurality of preformed molded thermoplastic pins integral with said substrate and molded concurrently therewith as extensions thereof, said pins projecting outwardly of the adjacent outermost surface areas of the mounting surface of the substrate to have the outer ends of the pins at positions adjacent to portions of the component which are adapted to be supportively backed by part of said substrate when the component is placed on the substrate, the pins having end portions adapted to be heated and formed about the adjacent portions of the component so as to form plastic locking portions, adapted to render said component engaged simultaneously on its opposite sides by, respectively, said locking portions and a firm seat provided for said component on the substrate side thereof, and so as, by such simultaneous engagement to provide a fastening without play of said component to said substrate.

11. A structure as recited in claim 10, wherein the mounting surface of the substrate is also formed with a pocket adapted to receive and locate a body portion of the component with respect to the lead-contact areas on the mounting surface of the substrate, so that the component leads extend along the mounting surface to positions overlapping the associated lead contact areas.

* * * * *